US008310868B2

(12) United States Patent
Kramer et al.

(10) Patent No.: US 8,310,868 B2
(45) Date of Patent: Nov. 13, 2012

(54) SPIN TORQUE TRANSFER MEMORY CELL STRUCTURES AND METHODS

(75) Inventors: Stephen J. Kramer, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 12/885,054

(22) Filed: Sep. 17, 2010

(65) Prior Publication Data
US 2012/0069647 A1  Mar. 22, 2012

(51) Int. Cl.
*G11C 11/15* (2006.01)
(52) U.S. Cl. ........ 365/171; 365/173; 365/158; 365/145; 257/295
(58) Field of Classification Search .......... 365/171, 365/173, 158, 145
See application file for complete search history.

(56) References Cited

U.S. PATENT DOCUMENTS

| | | | |
|---|---|---|---|
| 6,156,611 A | 12/2000 | Lan et al. | |
| 7,006,375 B2 | 2/2006 | Covington | |
| 7,598,579 B2 | 10/2009 | Horng et al. | |
| 7,709,885 B2 | 5/2010 | Daley et al. | |
| 7,742,328 B2 * | 6/2010 | Chen et al. | 365/158 |
| 2005/0045913 A1 * | 3/2005 | Nguyen et al. | 257/200 |
| 2005/0047198 A1 | 3/2005 | Engel et al. | |
| 2005/0199927 A1 * | 9/2005 | Lu | 257/295 |
| 2007/0285974 A1 * | 12/2007 | Takemura et al. | 365/158 |
| 2007/0296406 A1 | 12/2007 | Shin et al. | |
| 2008/0253174 A1 | 10/2008 | Yoshikawa et al. | |
| 2008/0310213 A1 * | 12/2008 | Chen et al. | 365/158 |
| 2009/0027810 A1 | 1/2009 | Horng et al. | |
| 2009/0096042 A1 | 4/2009 | Rizzo et al. | |
| 2009/0121266 A1 | 5/2009 | Pietambaram et al. | |
| 2009/0196818 A1 * | 8/2009 | Tokura et al. | 423/594.1 |
| 2009/0256220 A1 | 10/2009 | Horng et al. | |
| 2009/0279353 A1 * | 11/2009 | Worledge | 365/171 |
| 2009/0303779 A1 | 12/2009 | Chen et al. | |
| 2010/0065935 A1 | 3/2010 | Horng et al. | |

(Continued)

FOREIGN PATENT DOCUMENTS

EP  2328194 A1  6/2011

(Continued)

OTHER PUBLICATIONS

Bea et al., Spintronics with Multiferroics, Oct. 9, 2008, Journal of Physics Condensed Matter, 20, 434221.*

(Continued)

*Primary Examiner* — Hoai V Ho
*Assistant Examiner* — Jay Radke
(74) *Attorney, Agent, or Firm* — Brooks, Cameron & Huebsch, PLLC

(57) ABSTRACT

Spin Torque Transfer (STT) memory cell structures and methods are described herein. One or more STT memory cell structures comprise a STT stack including: a pinned ferromagnetic material in contact with an antiferromagnetic material; a tunneling barrier material positioned between a ferromagnetic storage material and the pinned ferromagnetic material; a multiferroic material in contact with the ferromagnetic storage material; and a first electrode and a second electrode, wherein the antiferromagnetic material, the pinned ferromagnetic material, and the ferromagnetic storage material are located between the first electrode and the second electrode. The STT memory cell structure can include a third electrode and a fourth electrode, wherein at least a first portion of the multiferroic material is located between the third and the fourth electrode.

44 Claims, 9 Drawing Sheets

U.S. PATENT DOCUMENTS

| | | | |
|---|---|---|---|
| 2010/0080048 A1* | 4/2010 | Liu et al. | 365/157 |
| 2010/0103730 A1 | 4/2010 | Shin | |
| 2010/0110783 A1 | 5/2010 | Liu et al. | |
| 2010/0193888 A1 | 8/2010 | Gu et al. | |
| 2010/0220516 A1 | 9/2010 | Lee et al. | |
| 2011/0134689 A1* | 6/2011 | Hayakawa | 365/171 |

FOREIGN PATENT DOCUMENTS

| | | |
|---|---|---|
| JP | 2010-098259 A | 4/2010 |
| WO | 2007099277 A1 | 9/2007 |
| WO | 2009010595 A1 | 1/2009 |
| WO | 2010/032574 A1 | 3/2010 |
| WO | 2010-039424 A1 | 4/2010 |

OTHER PUBLICATIONS

Chu et al., Electric-field Control of Local Ferromagnetism Using a Magnetoelectric Multiferroic, Nature Materials, vol. 7, pp. 478-482.*

Bea et al., Combining Half-metals and Multiferroics into Epitaxial Heterostructures for Spintronics, Feb. 6, 2006, Applied Physics Letters, 88, 062502.*

Chu et al., "Electric-field Control of Local Ferromagnetism Using a Magnetoelectric Multiferroic", Jun. 2008 (published online Apr. 27, 2008), Nature Materials, vol. 7, pp. 478-482.*

T. Zhao, et al. "Electrical control of antiferromagnetic domain in multiferroic BiFeO3 films at room temperature", Nature Materials, vol. 5, Oct. 2006, www.nature.com/naturematerials (7 pgs.).

F. Zavaliche, et al "Multiferroic BiFeO3 films: domain structure and polarization dynamics", Phase Transitions. vol. 79, No. 12, Dec. 2006, 991-1017, http://www.tandf.co.uk/journals (27 pgs.).

Manuel Bibes, et al. "Multiferroics Towards a magnetoelectric memory. The room-temperature manipulation of magnetization by an electric field using the multiferroic BiFeO3 represents an essential step towards the magnetoelectric control of spintronics devices", Nature Materials, vol. 7, Jun. 2008, www.nature.com/naturematerials (2 pgs.).

Ying-Hao Chu, et al "Electric-field control of local ferromagnetism using a magnetoelectric multiferroic", Nature Materials, vol. 7, Jun. 2008, www.nature.com/naturematerials (5 pgs.).

V. Garcia, et al. "Ferroelectric Control of Spin Polarization", Science, Feb. 26, 2010, vol. 327, No. 5969, pp. 1106-1110 (8 pgs.).

Zavaliche, et al., "Electrically Assisted Magnetic Recording in Multiferroic Nanostructures," May 11, 2007, 5 pages, vol. 7, No. 6.

Driskill-Smith, et al., "STT-RAM—A New Spin on Universal Memory," Jul. 9, 2007, pp. 28-32, Future Fab Intl., vol. 23.

International Search Report and Written Opinion for related PCT Applilcation No. PCT/US2011/001573, Mailed Mar. 28, 2012, (11 pages).

International Search Report and Written Opinion for related PCT Applilcation No. PCT/US2011/001584, Mailed Apr. 20, 2012, (9 pages).

International Search Report and Written Opinion for related PCT Applilcation No. PCT/US2011/001585, Mailed Apr. 20, 2012, (10 pages).

* cited by examiner

US 8,310,868 B2

SPIN TORQUE TRANSFER MEMORY CELL STRUCTURES AND METHODS

TECHNICAL FIELD

The present disclosure relates generally to semiconductor memory devices, methods, and systems, and more particularly, to spin torque transfer (STT) memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

MRAM devices can employ a magnetic tunneling junction (MTJ) that can be viewed as a multi-state resistor due to different relative orientations (e.g., parallel and antiparallel) of the magnetic moments, which can change the magnitude of a current passing through the device. In a write process, magnetic fields caused by currents passing through conductive lines (e.g., word and bit lines) can be used to switch a magnetic moment direction of a "free" material of the MTJ, which can place the device in a high or low resistance state. A read process can then be used to determine the state of cell.

As the size of MRAM cells decreases, the distance between adjacent cells also decreases, which can result in increased cell disturb caused by the current carrying lines used to switch the magnetic moment directions. As an example, the write current associated with a MRAM device can be about 10 mA. can be difficult as the size of the MRAM cells and current carrying lines decreases. For instance, the smaller width lines can require greater currents to produce the necessary switching fields, which increases power consumption.

STT devices share some of the operational features of previous MTJ cells; however, switching of the free material magnetic moment (e.g., the write process) can be produced by passage of the spin polarized current itself. For instance, unpolarized conduction electrons passing through a first magnetic material having its magnetic moment oriented in a given direction (e.g. a "pinned" material) are preferentially polarized by their passage through that material by a quantum mechanical exchange interaction with the polarized bound electrons in the material. Such a polarization can occur to conduction electrons that reflect from the surface of the magnetized material as well as to those that pass through it. The efficiency of such a polarization process can depend upon the crystalline structure of the material. When such a stream of polarized conduction electrons subsequently pass through a second magnetic material (e.g., the "free" material) whose polarization direction is not fixed in space, the polarized conduction electrons exert a torque on the bound electrons in the magnetic materials which, if sufficient, can reverse the polarization of the bound electrons and, thereby, reverse the magnetic moment of the magnetic material.

The use of a current internal to the cell to cause the magnetic moment reversal provides for smaller currents (e.g., about 200 microamps) than those required to produce an external magnetic field (e.g., from adjacent current carrying lines) to produce the moment switching. However, further reduction in the current used to produce magnetic moment switching in STT RAM cells can provide benefits such as further reducing the energy consumption and thermal profile in the materials associated with such cells, which can improve cell integrity and reliability, among other benefits.

DETAILED DESCRIPTION

Figure 1A:
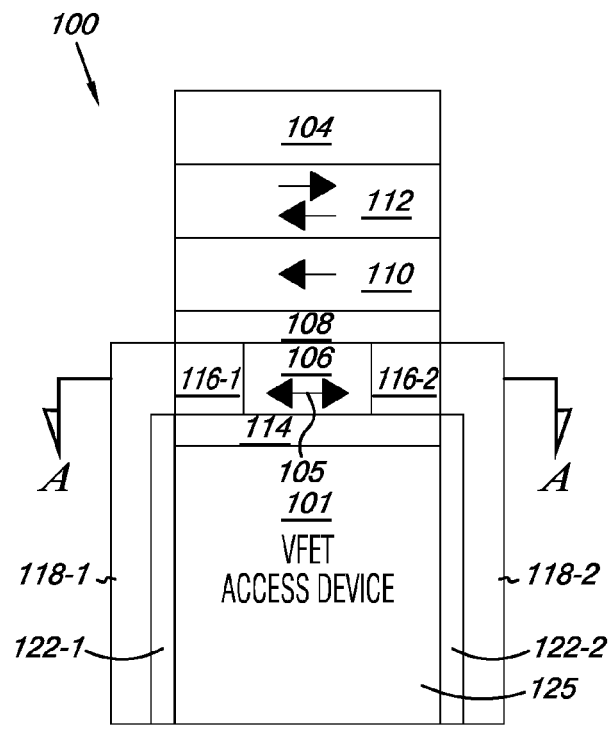
FIGS. 1A-1C illustrate an STT memory cell structure in accordance with one or more embodiments of the present disclosure.

STT memory cell structures and methods are described herein. One or more STT memory cell structures comprise a STT stack including: a pinned ferromagnetic material in contact with an antiferromagnetic material; a tunneling barrier material positioned between a ferromagnetic storage material and the pinned ferromagnetic material; a multiferroic material in contact with the ferromagnetic storage material; and a first electrode and a second electrode, wherein the antiferromagnetic material, the pinned ferromagnetic material, and the ferromagnetic storage material are located between the first electrode and the second electrode. The STT memory cell structure can include a third electrode and a fourth electrode, wherein at least a first portion of the multiferroic material is located between the third and the fourth electrode.

Embodiments of the present disclosure provide various benefits such as providing magnetic switching within STT memory cells via an applied electric field (e.g., due to exchange coupling between a multiferroic material in contact with a ferromagnetic storage material associated with the cell). Embodiments can provide for a reduced programming current as compared to previous STT memory cells. Embodiments can also provide benefits such as added data reliability and/or stability upon switching (e.g., by preventing thermally induced magnetic switching), multi-bit STT memory cell capability, and a reduced physical footprint as compared to previous STT memory cells, among other benefits.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 1B:
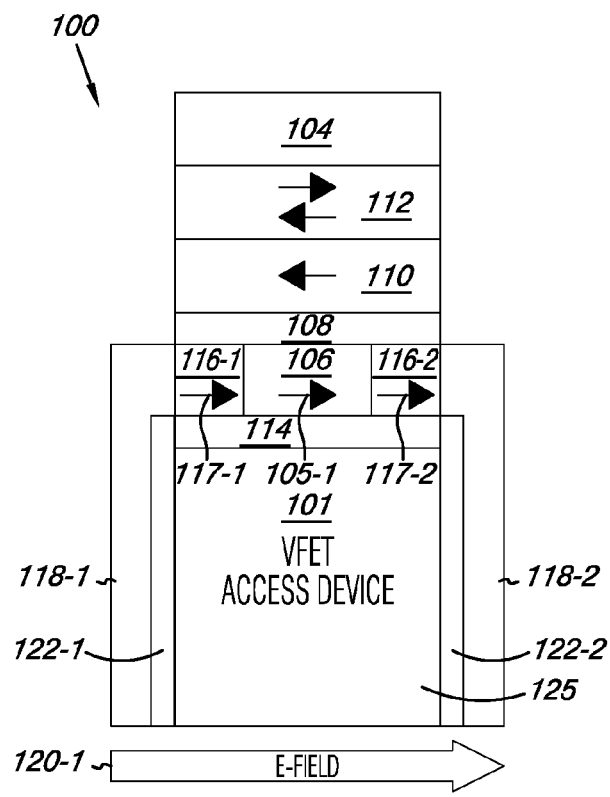
Figure 1C:
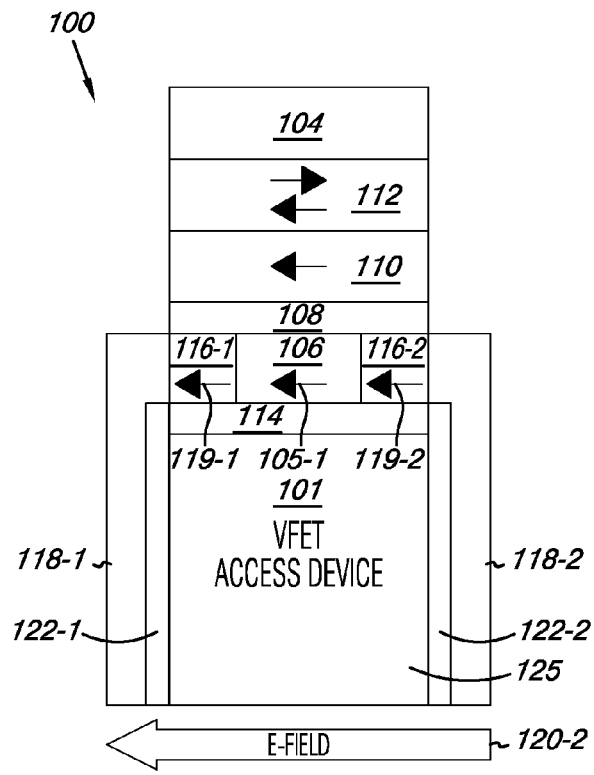

FIGS. 1A-1C illustrate an STT memory cell structure in accordance with one or more embodiments of the present disclosure. The memory cell structure illustrated in FIGS. 1A-1C is a STT stack structure 100 that includes a magnetic tunneling junction (MTJ) element positioned between a first electrode 104 (e.g., a top electrode) and a second electrode 114 (e.g., a bottom electrode). The MTJ element includes a tunneling barrier material 108 positioned between a ferromagnetic storage material 106 (e.g., a "free" ferromagnetic material) and a pinned ferromagnetic material 110 that is in contact with an antiferromagnetic material 112.

The arrow illustrated in the pinned ferromagnetic material 110 indicates the direction of magnetization within the material 110. The arrow 105 in the ferromagnetic storage material 106 of structure 100-1 indicates the alternative directions of the magnetization within material 106 (e.g., parallel or anti-parallel to the magnetization direction of material 110). As one of ordinary skill in the art will appreciate, a spin polarized current can be applied to the MTJ element (e.g., in a current perpendicular to plane configuration between the electrodes 104 and 114), which can switch the magnetization direction of the ferromagnetic storage material 106 when the critical switching current density ($J_c$) is exceeded. The different directions of magnetization 105 can correspond to particular data states of an STT RAM cell.

One or more embodiments of the present disclosure can alter and/or control the magnetic polarization of a "free" magnetic material (e.g., magnetization direction 105 of ferromagnetic storage material 106) in an STT memory cell via application of electric fields, which can reduce the programming current used to achieve magnetic polarization switching, among other benefits. One or more embodiments include a multiferroic material (e.g., a ferroelectric antiferromagnetic multiferroic material and/or a ferroelectric ferromagnetic material) in contact with a ferromagnetic storage material of an MTJ. Application of an electric field to the multiferroic material can be used to manipulate the antiferromagnetic ordering and/or ferromagnetic ordering within the multiferroic material (e.g., by changing the ferroelectric ordering coupled to the ferromagnetic and/or antiferromagnetic ordering within the multiferroic material). Exchange coupling between the multiferroic material (e.g., 116-1 and 116-2) and the ferromagnetic storage material (e.g., 106), influences the magnetization direction (e.g., 105) of the ferromagnetic storage material (e.g., 106). As such, the inherent coupling of the ferroic order parameters (e.g., the ferroelectric order parameter coupling with either or both of the ferromagnetic and antiferromagnetic order parameter) within a multiferroic material (e.g., 116-1 and 116-2) can be used to manipulate (e.g., switch) the magnetic polarization (e.g., 105) of a ferromagnetic material (e.g., 106) coupled thereto.

In some instances, the exchange coupling (e.g., antiferromagnetic and/or ferromagnetic exchange coupling) between the multi ferroic material and the ferromagnetic storage material may be sufficient to switch the magnetization direction of the storage material (e.g., from parallel to antiparallel or vice versa). In instances in Which the exchange coupling between the multiferroic material and the storage material is insufficient to induce a full switching of the magnetization direction of the storage material, a "magnetic torque" can be induced that can reduce the current required to induce full switching in the STT memory cell. Moreover, the induced magnetic torque can provide added data reliability and/or stability upon switching (e.g., by preventing thermally induced magnetic switching).

In the example illustrated in FIGS. 1A-1C, memory cell structure 100 includes a multiferroic material 116-1 in contact with ferromagnetic storage material 106 and a multiferroic material 116-2 in contact with ferromagnetic storage material 106. In various embodiments, the multiferroic material can be positioned between electrodes which are configured to provide an electric field to the multiferroic material (e.g., via an applied voltage difference between the electrodes). For instance, in FIGS. 1A-1C, the structure 100 includes electrodes 118-1 and 118-2, which are configured to provide an electric field to the multiferroic material 116-1 and 116-2. The electrodes 118-1 and 118-2 are side gate electrodes of a vertical access device 125 corresponding to the STT memory cell. As shown in FIGS. 1A-1C, the access device 125 can be a vertical field effect transistor (VFET); however, embodiments are not limited to a particular type of access device. The vertical access device 125 is formed from or on a substrate 101, which can be a silicon substrate, a silicon on insulator (SOI) substrate, or a silicon on sapphire (SOS) substrate, among others.

An applied voltage difference between the gate electrodes 118-1 and 118-2 creates an electric field that affects the antiferromagnetic and/or ferromagnetic ordering of the multiferroic material 116-1 and 116-2, which can alter the magnetization direction 105 of the ferromagnetic storage material 106. In this example, the gate electrodes 118-1 and 118-2 are directly coupled to the multiferroic material 116-1 and 116-2, respectively. However, an insulating material can be located between the electrodes 118-1 and 118-2. For instance, the gate oxide material 122-1 and 122-2 can be located between the gate electrodes 118-1 and 118-2 and the respective multiferroic material 116-1 and 116-2, in various embodiments. In one or more embodiments, the gate electrodes 118-1/118-2 can form a "surround gate" structure. For instance, the electrodes 118-1/118-2 can wrap around the access device 125. In some such embodiments, the electrodes 118-1/118-2 can be a single gate electrode that can surround the access device 125 and/or the multiferroic material (e.g., 116-1 and 116-2).

The embodiment of FIG. 1B illustrates an electric field 120-1 provided to the multiferroic material 116-1 and 116-2 via an applied voltage difference between the gate electrodes 1.18-1 and 118-2. The arrows 117-1 and 117-2 indicate the induced magnetization direction within the multiferroic material 116-1 and 116-2, respectively, due to the applied electric field 120-1. In the embodiment illustrated in FIGS.

1A-1C, the electrodes 118-1 and 118-2 are coupled to (e.g., in contact with) respective multiferroic material 116-1 and 116-2; however, embodiments are not so limited. Arrow 105-1 indicates the magnetization direction of the ferromagnetic storage material 106 (e.g., antiparallel to the magnetization direction of the pinned ferromagnetic material 110, in this example). The arrows 117-1, 117-2, and 105-1 are examples and may not represent the actual order parameter orientations within the respective materials.

The embodiment illustrated in FIG. 1C illustrates an electric field 120-2 provided to the multiferroic material 116-1 and 116-2 via an applied voltage difference between the gate electrodes 118-1 and 118-2. Using the gate electrodes 118-1 and 118-2 of the access device 125 to provide the electric field 120-1/120-2 to the multiferroic material 116-1/116-2 can provide benefits such as reducing the physical footprint of an STT memory cell (e.g., as opposed to an STT memory cell using separate electrodes, which may be external to the cell stack, to provide the electric field 120-1/120-2).

The arrows 119-1 and 119-2 indicate the induced magnetization direction within the multiferroic material 116-1 and 116-2, respectively, due to the applied electric field 120-2. Arrow 105-1 shown in FIG. 1C indicates the magnetization direction corresponding to the ferromagnetic storage material 106 of the STT memory structure (e.g., parallel to the magnetization direction of the pinned ferromagnetic material 110, in this example). In the example illustrated in FIG. 1C, the exchange coupling between the multiferroic material 116-1/116-2 and the ferromagnetic storage material 106 resulting from the electric field 120-2 is sufficient to switch the direction of the magnetization within the storage material 106 (e.g., from the antiparallel direction 105-1 shown in FIG. 1B to the parallel direction 105-1 shown in FIG. 1C). The arrows 119-1, 119-2, and 105-1 are examples and may not represent the actual order parameter orientations within the respective materials.

As noted above, in one or more embodiments, the electric field between the electrodes (e.g., 118-1 and 118-2) may not be sufficient to fully switch the magnetization of the ferromagnetic storage material 106. However, in such cases, a remnant magnetic torque can be induced within the storage material 106, which can reduce the barrier to switching in the STT memory cell 100. For instance, the required current density to induce switching of the magnetization (e.g., from antiparallel to parallel) is reduced due to the exchange coupling between the multiferroic 116-1/116-2 and the storage material 106 under the applied electric field 120-2.

As illustrated in FIGS. 1A-1C, the memory cell structure 100 is configured such that an inner edge portion of the multiferroic material 116-1 is in contact with a first edge portion of the ferromagnetic storage material 106 and an inner edge portion of the multiferroic material 116-2 is in contact with a second edge portion of the ferromagnetic storage material 106. As such, the multiferroic materials 116-1 and 116-2 are in line with the ferromagnetic storage material 106. The respective outer edges of the multiferroic materials 116-1 and 116-2 are aligned with an outer edge of the tunneling barrier material 108, in this example. In this example, at least a portion of the multiferroic material 116-1 and 116-2 is in contact with the tunneling barrier material 108. In one or more embodiments, the multiferroic material 116-1 and 116-2 can be continuous around the ferromagnetic storage material 106 (e.g., as shown in cross-section 102-2 illustrated in FIG. 1D).

As described further below in connection with FIG. 1E, the STT memory cell structure 100 can be a multi-bit structure (e.g., the cell can be configured to store multiple data bits). In some such embodiments, the vertical access device 125 can include dual opposing gate electrodes (e.g., a third and a fourth gate electrode such as electrodes 118-3 and 118-4 shown in. FIG. 1E). In such embodiments, the STT memory cell 100 can include at least a third multiferroic material (e.g., 116-3/116-4 shown in. FIG. 1E) in contact with the ferromagnetic storage material 106 and located between the third and the fourth gate electrodes.

Figure 1D:
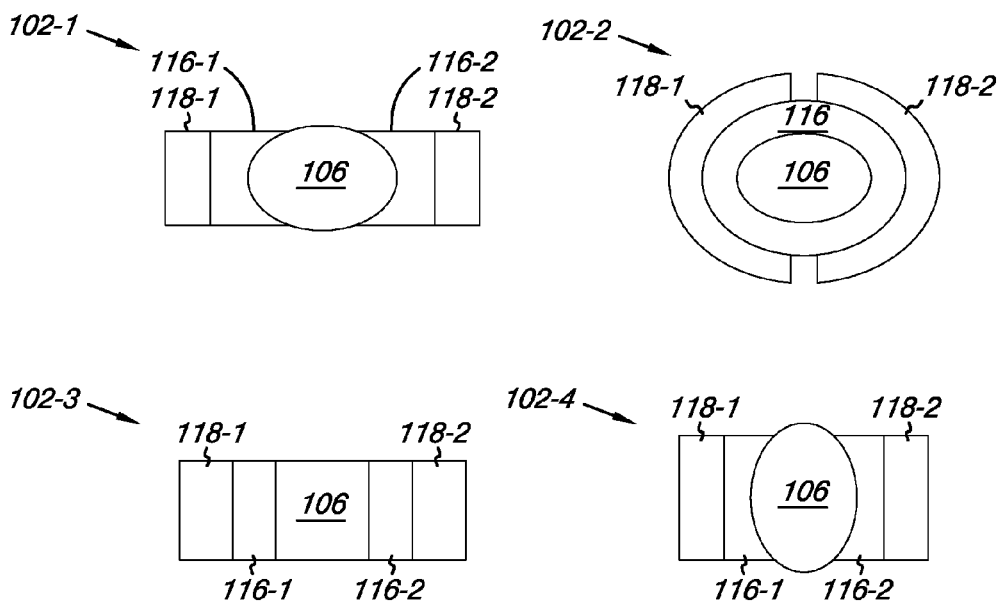
FIG. 1D illustrates a number of example over head cross-sectional views through cut line A shown in FIG. 1A in accordance with embodiments of the present disclosure.
Figure 1E:
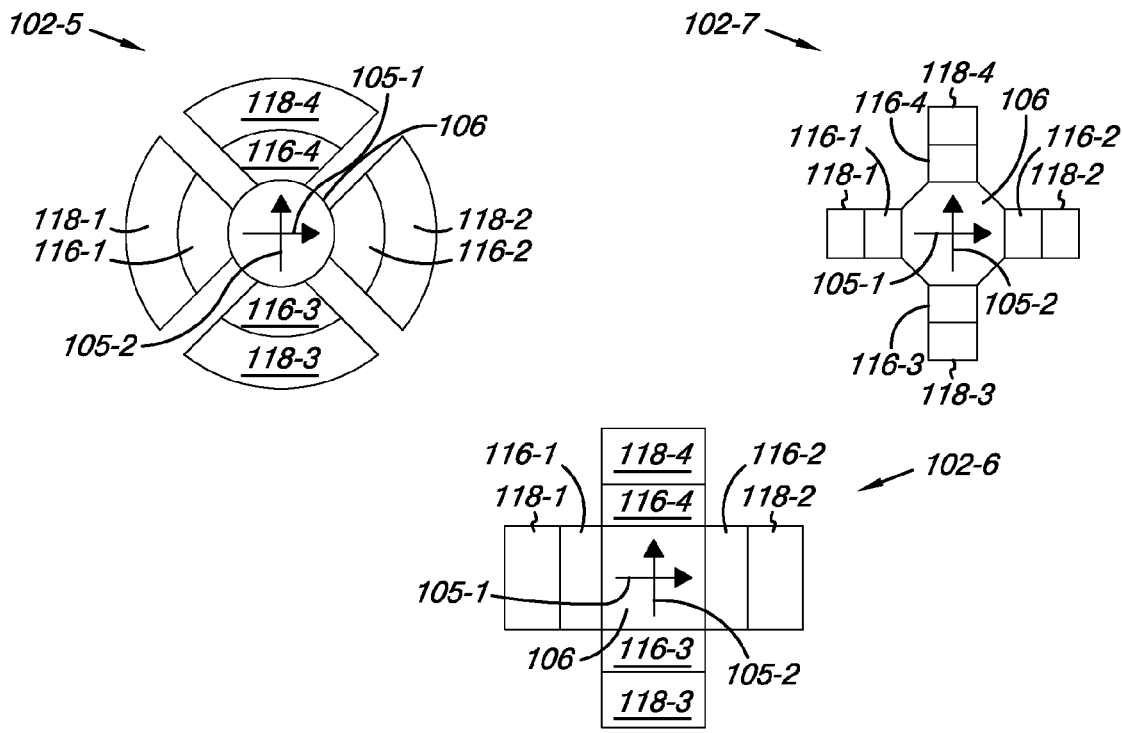
FIG. 1E illustrates a number of example over head cross-sectional views through cut line A shown in FIG. 1A in accordance with embodiments of the present disclosure.

FIG. 1D illustrates a number of example over head cross-sectional views through cut line A shown in FIG. 1A in accordance with embodiments of the present disclosure. As illustrated in FIG. 1D, the ferromagnetic storage material 1.06 and the multiferroic material 116-1/116-2 in contact with the storage material 106 can have various shapes.

For instance, cross-sectional views 102-1 and 102-2 illustrate ferromagnetic storage material 106 having an elongated structure (e.g., oval). Providing a ferromagnetic storage material 106 having an elongated structure can provide for a preferred magnetic "easy" axis along the long axis (e.g., due to shape anisotropy). In this example, the material 106 is positioned such that the "easy" axis is parallel to an electric field (e.g., 120-1/120-2) provided between the gate electrodes 118-1/118-2.

The cross-sectional view 102-3 includes ferromagnetic storage material 106 having a quadrilateral (e.g., square) shape. The cross-sectional view 102-4 includes ferromagnetic storage material 106 having an oval structure rotated ninety degrees from that shown in views 102-1 and 102-2. As such, the material 106 is positioned such that the "easy" axis is transverse to an electric field (e.g., 120-1/120-2) provided between the gate electrodes 1184/118-2).

FIG. 1E illustrates a number of example over head cross-sectional views through cut line A shown in FIG. 1A in accordance with embodiments of the present disclosure. In each of the over head views 102-5, 102-6, and 102-7, the STT memory cell structure 100 includes dual opposing gate electrodes (e.g., gate electrodes 118-1 and 118-2 oppose each other and gate electrodes 118-3 and 118-4 oppose each other).

The electrodes 118-1 and 118-2 are configured to provide an electric field to the multiferroic material 116-1 and 116-2 in response to an applied voltage difference. The electrodes 118-3 and 118-4 are configured to provide an electric field (in a direction transverse to the electric field between electrodes 118-1 and 118-2) to the multiferroic material 116-3 and 116-4 in response to an applied voltage difference. As such, the dual opposing gate structure allows for manipulation of the magnetization of the ferromagnetic material 106 in two different directions via applied electric fields. For instance, an electric field between electrodes 118-1 and 118-2 can be used to alter the magnetization direction 105-1 of ferromagnetic material 106, and an electric field between electrodes 118-3 and 118-4 can be used to alter the magnetization direction 105-2 of ferromagnetic material 106 (e.g., in a direction transverse to direction 105-1).

As an example, the magnetization direction 105-1 can correspond to a first and a second data state, and the magnetization direction 105-2 can correspond to a third and a fourth data state. As such, the different orientations of magnetization directions 105-1 and 105-2 can correspond to multiple bits of data stored in STT memory cell 100.

Figure 2A:
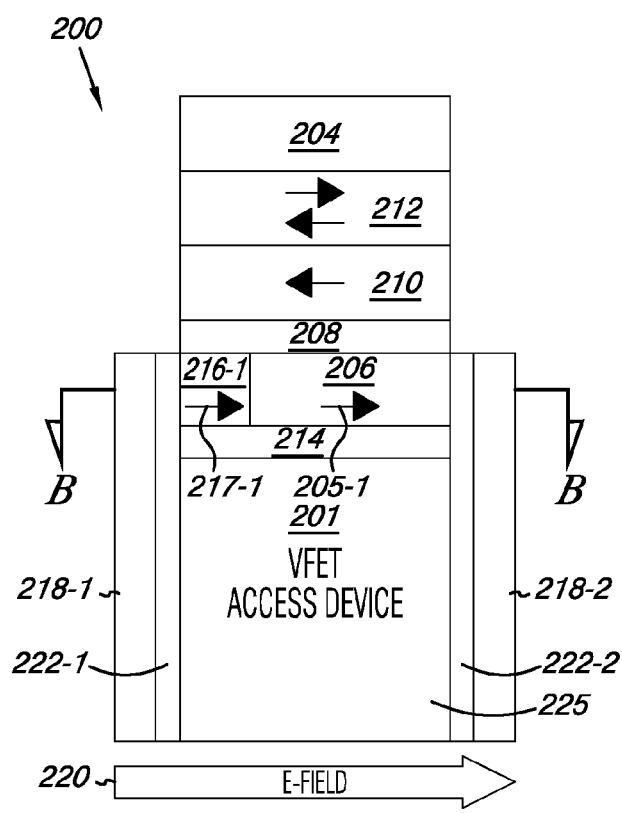
FIG. 2A illustrates an STT memory cell structure in accordance with one or more embodiments of the present disclosure.

FIG. 2A illustrates an STT memory cell structure 200 in accordance with one or more embodiments of the present disclosure. The memory cell structure 200 illustrated in FIG. 2A is similar to the memory cell structure 100 shown in FIGS. 1A-1C in that the structure 200 includes a MTJ element positioned between a first electrode 204 and a second electrode 214. The MTJ element includes a tunneling barrier material 208 positioned between a ferromagnetic storage material 206 and a pinned ferromagnetic material 210 that is in contact with an antiferromagnetic material 212.

The structure 200 includes a multiferroic material 216-1 in contact with ferromagnetic storage material 206. The structure 200 includes gate electrodes 218-1 and 218-2 configured to provide an electric field (e.g., 220) to the multiferroic material 216-1 responsive to an applied voltage between the gate electrodes 218-1/218-2. The electric field 220 is sufficient to induce a magnetic polarization change in the multiferroic material 216-1 (e.g., as indicated by arrow 217-1). The exchange coupling between the multiferroic 216-1 and the ferromagnetic storage material 206 can influence the magnetization direction 205-1 of the ferromagnetic storage material 206. In the example illustrated in FIG. 2A, a gate oxide material 222-1 corresponding to vertical access device 225 separates the multiferroic material 216-1 from the gate electrode 218-1 and a gate oxide material 222-2 separates the ferromagnetic storage material 206 from the gate electrode 218-2. The arrows 217-1 and 205-1 are examples and may not represent the actual order parameter orientations within the respective materials.

Figure 2B:
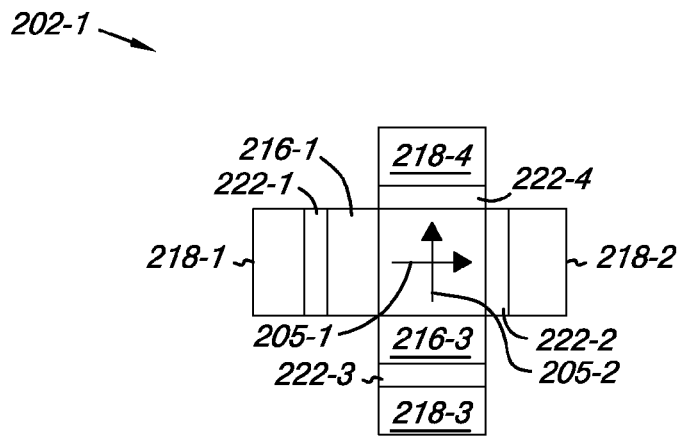
FIG. 2B illustrates an example over head cross-sectional view through cut line B shown in FIG. 2A in accordance with one or more embodiments of the present disclosure.

FIG. 2B illustrates an example over head cross-sectional view 202-1 through cut line B shown in FIG. 2A in accordance with one or more embodiments of the present disclosure. Similar to the embodiments described above in connection with FIG. 1E, the STT memory cell structure 200 includes dual opposing gate electrodes (e.g., gate electrodes 218-1 and 218-2 oppose each other and gate electrodes 218-3 and 218-4 oppose each other).

The electrodes 218-1 and 218-2 are configured to provide an electric field to the multiferroic material 216-1 in response to an applied voltage difference. The electrodes 218-3 and 218-4 are configured to provide an electric field (e.g., in a direction transverse to the electric field between electrodes 218-1 and 218-2) to the multiferroic material 216-2 in response to an applied voltage difference. As such, the dual opposing gate structure allows for manipulation of the magnetization of the ferromagnetic material 206 in two different directions via applied electric fields. For instance, an electric field between electrodes 218-1 and 218-2 can be used to alter the magnetization direction 205-1 of ferromagnetic material 206, and an electric field between electrodes 218-3 and 218-4 can be used to alter the magnetization direction 205-2 of ferromagnetic material 206 (e.g., in a direction transverse to direction 205-1). As such, the different orientations of magnetization directions 205-1 and 205-2 can correspond to multiple bits of data stored in STT memory cell 200.

Figure 3A:
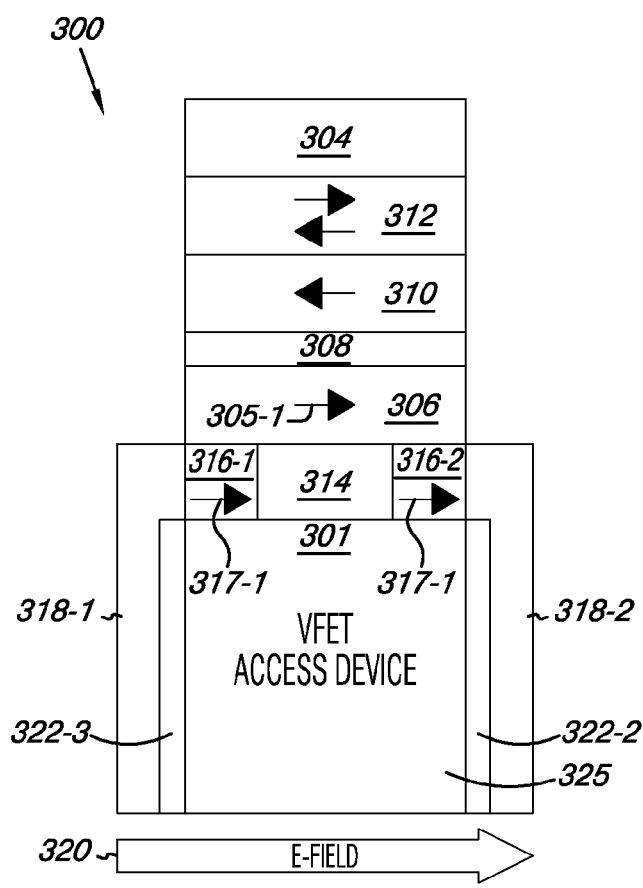
FIG. 3A illustrates an STT memory cell structure in accordance with one or more embodiments of the present disclosure.

FIG. 3A illustrates an STT memory cell structure 300 in accordance with one or more embodiments of the present disclosure. The memory cell structure 300 is similar to the memory cell structure illustrated in FIGS. 1A-1C in that the structure is a STT stack structure 300 that includes a MTJ element positioned between a first electrode 304 (e.g., a top electrode) and a second electrode 314 (e.g., a bottom electrode). The MTJ element includes a tunneling barrier material 108 positioned between the ferromagnetic storage material 306 and the pinned ferromagnetic material 310 that is in contact with the antiferromagnetic material 312.

The arrow 305-1 in the ferromagnetic storage material 306 indicates the direction of the magnetization within material 306 (e.g., antiparallel to the magnetization direction of material 310 due to the electric field 320, in this example). The memory cell structure 300 includes a multiferroic material 316-1 in contact with ferromagnetic storage material 306 and a multiferroic material 316-2 in contact with ferromagnetic storage material 306. In this example, an upper surface of the multiferroic material 316-1 is in contact with a bottom surface of the ferromagnetic storage material 306 and an upper surface of the multiferroic material 316-2 is in contact with the bottom surface of the ferromagnetic storage material 306. The multiferroic materials 316-1 and 316-2 are positioned between the gate electrodes 318-1 and 318-2, which are configured to provide an electric field (e.g., 320) to the multiferroic materials 316-1 and 316-2. The gate electrodes 318-1 and 318-2 are side gate electrodes of vertical access device 325 corresponding to the STT memory cell. In this example, the gate electrodes 318-1 and 318-2 are directly coupled to the multiferroic material 316-1 and 316-2, respectively. However, an insulating material (e.g., a gate oxide material) can be located between the electrodes 318-1 and 318-2, in some embodiments.

In the example illustrated in FIG. 3A, the multiferroic materials 316-1 and 316-2 are in line with the bottom electrode 314. As shown, the bottom electrode 314 is located between the first and the second multiferroic materials 316-1 and 316-2.

The electric field 320 (e.g., via an applied voltage difference between the electrodes 318-1/318-2) can induce a magnetic polarization direction change in the multiferroic material 316-1/316-2 (e.g., as indicated by arrows 317-2 and 317-2). As described above, exchange coupling between the multiferroic material 316-1/316-2 and the ferromagnetic storage material 306 can result in the magnetization direction 305-1. The arrows 317-1, 317-2, and 305-1 are examples and may not represent the actual order parameter orientations within the respective materials.

As noted above, in one or more embodiments, the electric field between the electrodes (e.g., 318-1 and 318-2) may not be sufficient to fully switch the magnetization orientation of the ferromagnetic storage material 306. However, in such cases, a remnant magnetic torque can be induced within the storage material 306, which can reduce the barrier to switching in the STT memory cell 300. For instance, the required current density to induce switching of the magnetization (e.g., from antiparallel to parallel) is reduced due to the exchange coupling between the multiferroic 316-1/316-2 and the storage material 306 under the applied electric field 320.

The memory cell structure 300 is configured such that at least a portion of the multiferroic material 316-1 and at least a portion of the multiferroic material 316-2 is located beneath the ferromagnetic storage material 306. An inner edge portion of the multiferroic material 316-1 is in contact with an edge portion of the bottom electrode 314 and an inner edge portion of the multiferroic material 316-2 is in contact with an edge portion of the bottom electrode 314. In this example, the respective outer edges of the multiferroic materials 316-1 and 316-2 are aligned with an outer edge of the ferromagnetic storage material 306 and with an outer edge of the tunneling barrier material 308.

As described above in connection with FIGS. 1E and 2B, the STT memory cell structure 300 can be a multi-bit structure. For instance, as shown in the overhead cross-section views (e.g., 302-1, 302-2, and 302-3) of FIG. 3B, the vertical access device 325 can include dual opposing gate electrodes (e.g., opposing gates 318-1/318-2 and opposing gates 318-3/318-4). In such embodiments, the STT memory cell 300 can include a third multiferroic material 316-3 and a fourth multiferroic material 316-4 in contact with the ferromagnetic storage material 306 and located between the third and the fourth gate electrodes 318-3/318-4.

Similar to that described above, an electric field (e.g., 320) between electrodes 318-1 and 318-2 can be used to alter the magnetization direction 305-1 of ferromagnetic material 306, and an electric field between electrodes 318-3 and 318-4 can be used to alter the magnetization direction 305-2 of ferromagnetic material 306 (e.g., in a direction transverse to direction 305-1). The magnetization direction 305-1 can correspond to a first and a second data state (e.g., a :first data bit), and the magnetization direction 305-2 can correspond to a third and a fourth data state (e.g., a second data bit). As such, the different orientations of magnetization directions 305-1 and 305-2 can correspond to multiple bits of data stored in STT memory cell 300.

Figure 4A:
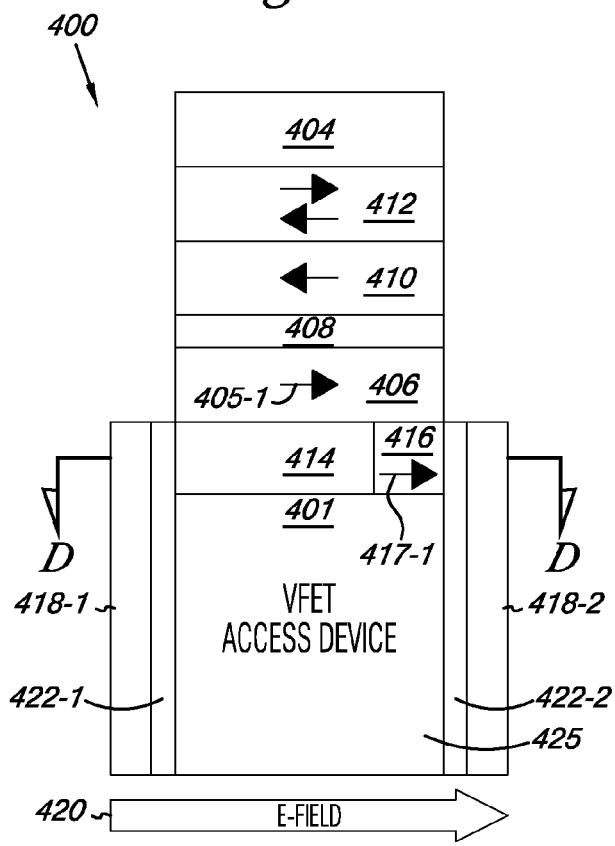
FIG. 4A illustrates an STT memory cell structure in accordance with one or more embodiments of the present disclosure.

FIG. 4A illustrates an STT memory cell structure 400 in accordance with one or more embodiments of the present disclosure. The memory cell structure 400 illustrated in FIG. 4A is similar to the memory cell structure 300 shown in FIG. 3A in that the structure 400 includes a MTJ element positioned between a first electrode 404 and a second electrode 414. The MTJ element includes a tunneling barrier material 408 positioned between a ferromagnetic storage material 406 and a pinned ferromagnetic material 410 that is in contact with an antiferromagnetic material 412.

The structure 400 includes a multiferroic material 416-1 in contact with ferromagnetic storage material 406. The structure 400 includes gate electrodes 418-1 and 418-2 configured to provide an electric field (e.g., 420) to the multiferroic material 416-1 responsive to an applied voltage between the gate electrodes 418-1/418-2. The electric field 420 is sufficient to induce a magnetic polarization change in the multiferroic material 416-1 (e.g., as indicated by arrow 417-1). The exchange coupling between the multiferroic 416-1 and the ferromagnetic storage material 406 can influence the magnetization direction 405-1 of the ferromagnetic storage material 406. In the example illustrated in FIG. 4A, a gate oxide material 422-2 corresponding to vertical access device 425 separates the multiferroic material 416-1 from the gate electrode 418-2 and a gate oxide material 422-1 separates the bottom electrode 414 from the gate electrode 418-1. An inner edge portion of the multiferroic material 416-1 is in contact with an inner edge portion of the bottom electrode 414.

Figure 3B:
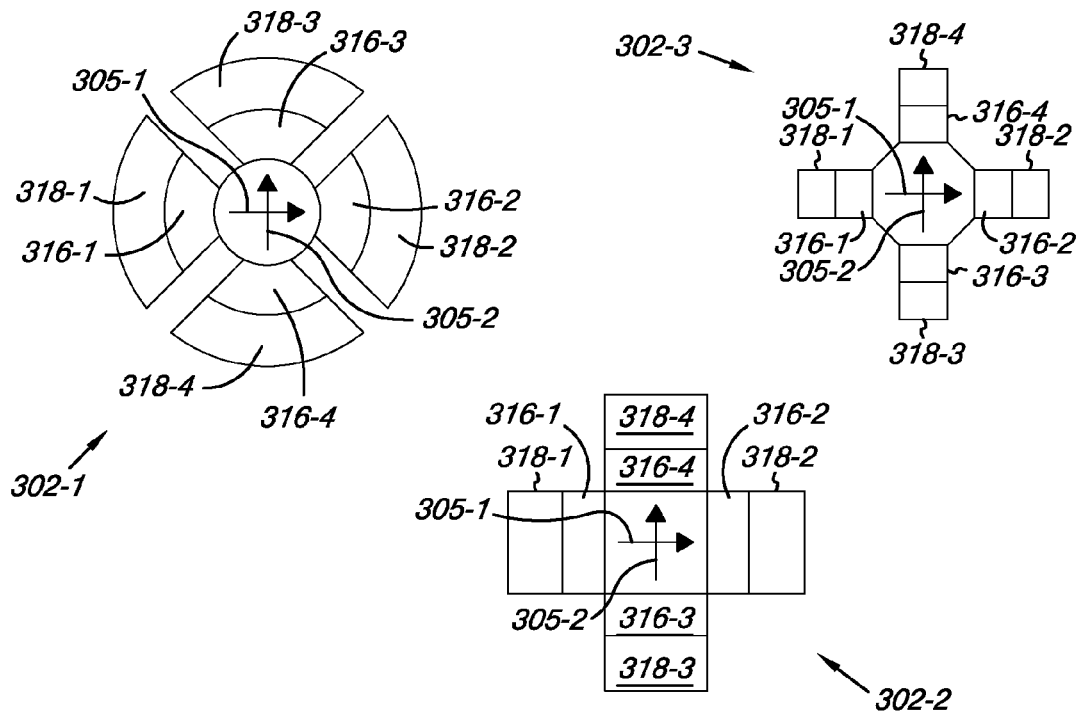
FIG. 3B illustrates a number of example over head cross-sectional views through cut line C shown in FIG. 3A in accordance with embodiments of the present disclosure.
Figure 4B:
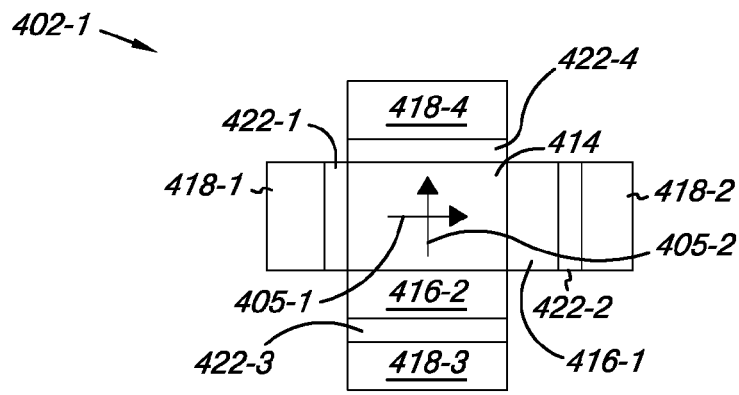
FIG. 4B illustrates an example over head cross-sectional view through cut line D shown in FIG. 4A in accordance with one or more embodiments of the present disclosure.

FIG. 4B illustrates an example over head cross-sectional view 402-1 through cut line D shown in FIG. 4A in accordance with one or more embodiments of the present disclosure. Similar to the embodiments described above in connection with FIGS. 1E, 2B, and 3B, the STT memory cell structure 400 includes dual opposing gate electrodes (e.g., gate electrodes 418-1 and 418-2 oppose each other and gate electrodes 418-3 and 418-4 oppose each other).

The electrodes 418-1 and 418-2 are configured to provide an electric field to the multiferroic material 416-1 in response to an applied voltage difference. The electrodes 418-3 and 418-4 are configured to provide an electric field (e.g., in a direction transverse to the electric field between electrodes 418-1 and 418-2) to the multiferroic material 416-2 in response to an applied voltage difference. As such, the dual opposing gate structure allows for manipulation of the magnetization of the ferromagnetic material 406 in two different directions via applied electric fields. For instance, an electric field between electrodes 418-1 and 418-2 can be used to alter the magnetization direction 405-1 of ferromagnetic material. 406, and an electric field between electrodes 418-3 and 418-4 can be used to alter the magnetization direction 405-2 of ferromagnetic material 406 (e.g., in a direction transverse to direction 405-1). As such, the different orientations of magnetization directions 405-1 and 405-2 can correspond to multiple bits of data stored in STT memory cell 400.

Figure 5:
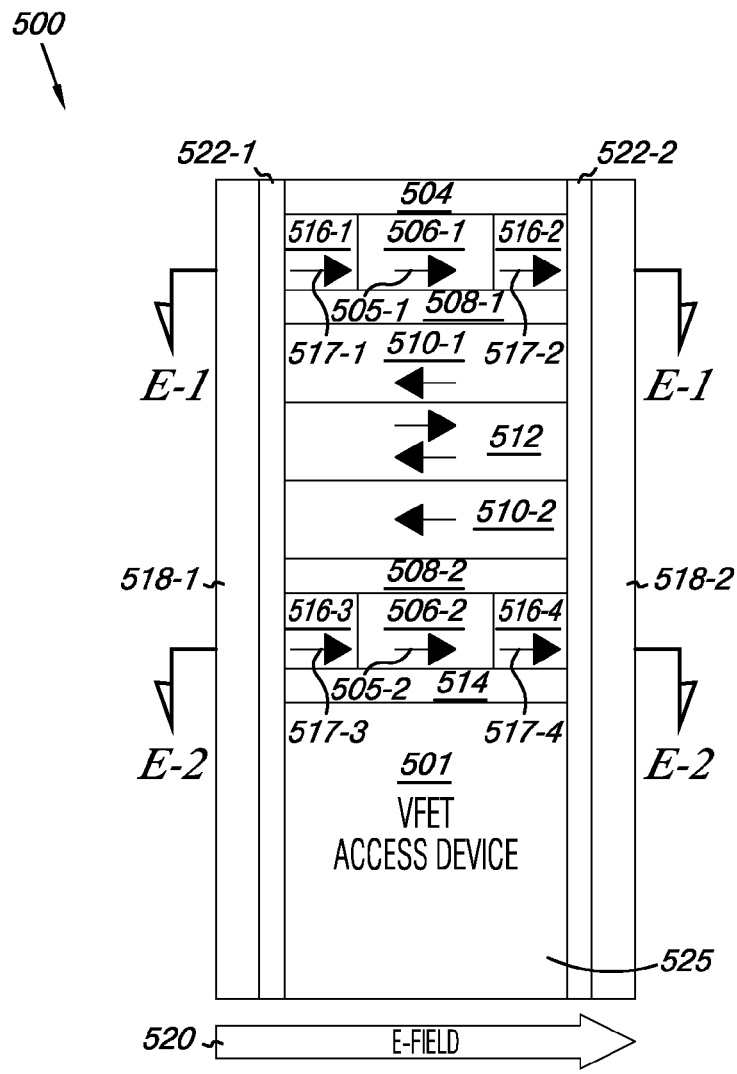
FIG. 5 illustrates an STT memory cell structure in accordance with one or more embodiments of the present disclosure.

FIG. 5 illustrates an STT memory cell structure 500 in accordance with one or more embodiments of the present disclosure. The memory cell structure 500 is a multi-bit STT RAM structure and is similar to the STT stack structure 100 shown in. FIGS. 1A-1C. However, the stack structure 500 includes multiple levels configured for data storage. For instance, the stack structure 500 comprises a first level including a first ferromagnetic storage material 506-1 in contact with a first multiferroic material 516-1 and a second multiferroic material 516-2. A first tunneling barrier material 508-1 is positioned between the first ferromagnetic storage material 506-1 and a first pinned ferromagnetic material 510-1. The stack structure 500 comprises a second level including a second ferromagnetic storage material 506-2 in contact with a third multiferroic material 516-3 and a fourth multiferroic material 516-4. A second tunneling barrier material 508-2 is positioned between the second ferromagnetic storage material 506-2 and a second pinned ferromagnetic material 510-2. The first and second levels of stack structure 500 are separated by an antiferromagnetic material 512 positioned between, and in contact with, the first and the second pinned ferromagnetic materials 510-1 and 510-2, respectively. The multiferroic materials 516-1, 516-2, 516-3, and 516-4 are each located between a first gate electrode 518-1 and a second gate electrode 518-2 of a vertical access device 525 coupled to the stack structure 500. In this example, a gate oxide material 522-1 and 522-2 associated with vertical access device 525 separates portions of the stack 500 from the gate electrodes 518-1 and 518-2, respectively.

The arrow illustrated in the first and second pinned ferromagnetic materials 510-1 and 510-2 indicates the direction of magnetization within the respective material 510-1 and 510-2. The first and second storage materials 506-1 and 506-2 each have a switchable magnetization (e.g., the magnetization direction 505-1 of material 506-1 and the magnetization direction 505-2 of material 506-2 is switchable between parallel and antiparallel orientation with respect to the orientation of the magnetization of the respective pinned ferromagnetic material 510-1 and 510-2). In a programming (e.g., a write) operation, a spin polarized current can be applied through the stack structure 500 (e.g., between the bottom electrode 514 and the top electrode 504) in order to switch the magnetization direction of the ferromagnetic storage material 506-1 and/or 506-2 (e.g., when the critical switching current density ($J_c$) is exceeded). The different directions of magnetizations 505-1 and 505-7 can correspond to particular data states of the STT RAM cell. 100591 One or more embodiments of the present disclosure can alter and/or control the magnetization direction 505-1 of ferromagnetic storage material 506-1 and the magnetization direction 505-2 of ferromagnetic storage material 506-2) via application of electric fields, which can reduce the programming current used to achieve magnetic polarization switching of the ferromagnetic materials 506-1 and 506-2, among other benefits. For example, application of an electric field to the multiferroic materials 516-1, 516-2, 516-3, and 516-4 (e.g., via an applied voltage difference between the gate electrodes 518-1 and 518-2) can be used to manipulate the antiferromagnetic ordering and/or ferromagnetic ordering of the multiferroic materials 516-1, 516-2, 516-3, and 516-4. Due to exchange coupling between the multiferroic materials 516-1/516-2 and the ferromagnetic storage material 506-1 and due to exchange coupling between the multiferroic materials 516-3/516-4 and the ferromagnetic storage material 506-2, the antiferromagnetic and/or ferromagnetic ordering of the multiferroic materials 516-1, 516-2, 516-3, and 516-4 influences the magnetization directions 505-1 and 505-2 of the ferromagnetic storage materials 506-1 and 506-2. The arrows 517-1, 517-2-

2, 517-3, 517-4, 505-1, and 505-2 are examples and may not represent the actual order parameter orientations within the respective materials.

As described above, in instances in which the exchange coupling between the multiferroic material and the storage material is insufficient to induce a full switching of the magnetization direction of the storage material, a "magnetic torque" can be induced that can reduce the current required to induce full switching in the STT memory cell 500. Moreover, the induced magnetic torque can provide added data reliability and/or stability upon switching (e.g., by preventing thermally induced magnetic switching).

The embodiment of FIG. 5 illustrates an electric field 520 provided to the multiferroic materials 516-1, 516-2, 516-3, and 516-4 via an applied voltage difference between the gate electrodes 518-1 and 518-2. The arrows 517-1 and 517-2 indicate the induced magnetization direction within the multiferroic material 516-1 and 516-2, respectively, due to the applied electric field 520. The arrows 517-3 and 517-4 indicate the induced magnetization direction within the multiferroic material 516-3 and 516-4, respectively, due to the applied electric field 520. Arrow 505-1 indicates the magnetization direction of the ferromagnetic storage material 506-1 (e.g., antiparallel to the magnetization direction of the pinned ferromagnetic material 510-1, in this example). Arrow 505-2 indicates the magnetization direction of the ferromagnetic storage material 506-2 (e.g., antiparallel to the magnetization direction of the pinned ferromagnetic material 510-2, in this example).

Use of the gate electrodes 518-1 and 518-2 of the access device 525 to provide the electric field (e.g., 520) to the multiferroic materials 516-1, 516-2, 516-3, and 516-4 can provide benefits such as reducing the physical footprint of the STT memory cell (e.g., as compared to an STT memory cell using separate electrodes, external to the cell stack 500, to provide the electric field 520).

The STT memory cell structure 500 is configured such that an inner edge portion of the multiferroic material 516-1 is in contact with a first edge portion of the first ferromagnetic storage material 506-1 and an inner edge portion of the multiferroic material 516-2 is in contact with a second edge portion of the first ferromagnetic storage material 506-1. An inner edge portion of the multiferroic material 516-3 is in contact with a first edge portion of the second ferromagnetic storage material 506-2 and an inner edge portion of the multiferroic material 516-4 is in contact with a second edge portion of the second ferromagnetic storage material 506-2. As such, the multiferroic materials 516-1 and 516-2 are in line with the first ferromagnetic storage material 506-1 and the multiferroic materials 516-3 and 516-4 are in line with the second ferromagnetic storage material 506-2. The respective outer edges of the multiferroic materials 516-1 and 516-2 are aligned with an outer edge of the first tunneling barrier material 508-1 and the respective outer edges of the multiferroic materials 516-3 and 516-4 are aligned with an outer edge of the second tunneling barrier material 508-2, in this example. In this example, at least a portion of the multiferroic material 516-1 and 516-2 is in contact with the first tunneling barrier material 508-1, and at least a portion of the multiferroic material 516-3 and 516-4 is in contact with the second tunneling barrier material 508-2. In one or more embodiments, the multiferroic material 516-1 and 516-2 can be a continuous material around the ferromagnetic storage material 506-1 and/or the multiferroic material 516-3 and 516-4 can be a continuous material around the ferromagnetic storage material 506-2 (e.g., as shown in cross-section 102-2 illustrated in FIG. 1D).

An overhead cross-sectional view through cut line E-1 or cut line E-2 shown in FIG. 5 can be a cross-sectional view such as those shown in FIG. 1D. As such, the ferromagnetic storage materials 506-1 and 506-2, the multiferroic materials, 516-1, 516-2, 516-3, and 516-4, and the gate electrodes, 518-1 and 518-2 can have various physical structures. In some embodiments, the vertical access device 525 can include dual opposing gate electrodes. In such embodiments, a cross-sectional view through cut line E-1 or cut line E-2 shown in FIG. 5 can be a cross-sectional view such as those shown in FIG. 1E, for example. Embodiments are not limited to a particular structure.

As mentioned above, in one or more embodiments, the gate electrodes 518-1/518-2 can form a "surround gate" structure. For instance, the electrodes 518-1/518-2 can wrap around the access device 525. In some such embodiments, the electrodes 518-1/518-2 can be a single gate electrode that can surround the access device 525 and/or the multiferroic material (e.g., 516-1/516-2 and 516-3/516-4).

In one or more embodiments, the multiferroic materials 516-1 and 516-2 can have a ferroelectric polarizability that is different from the ferroelectric polarizability of the multiferroic materials 516-3 and 516-4. Differing ferroelectric polarizabilities can lead to different voltage requirements associated with the particular multiferroic material. As such, the applied voltage difference between gate electrodes 518-1 and 518-2 required to produce an electric field sufficient to rotate the antiferromagnetic and/or ferromagnetic order within the multiferroic material (e.g., 516-1, 516-2, 516-3, and 516-4) can vary depending on the type of multiferroic material. As an example, the first and second multiferroic material 516-1/516-2 may be $BiFeO_3$ (BFO) and the third and fourth multiferroic material may be $TbMn_2O_5$. In some such embodiments, a particular electric field (e.g., 520) provided to the stack structure 500 may be sufficient to switch the magnetization direction of one of the first and the second ferromagnetic storage material 506-1/506-2 while being insufficient to switch the magnetization direction of the other ferromagnetic storage material 506-1/506-2. As such, the relative orientations of the magnetization directions 505-1 and 505-2 can be controlled via an applied electric field (e.g., 520).

Figure 6:
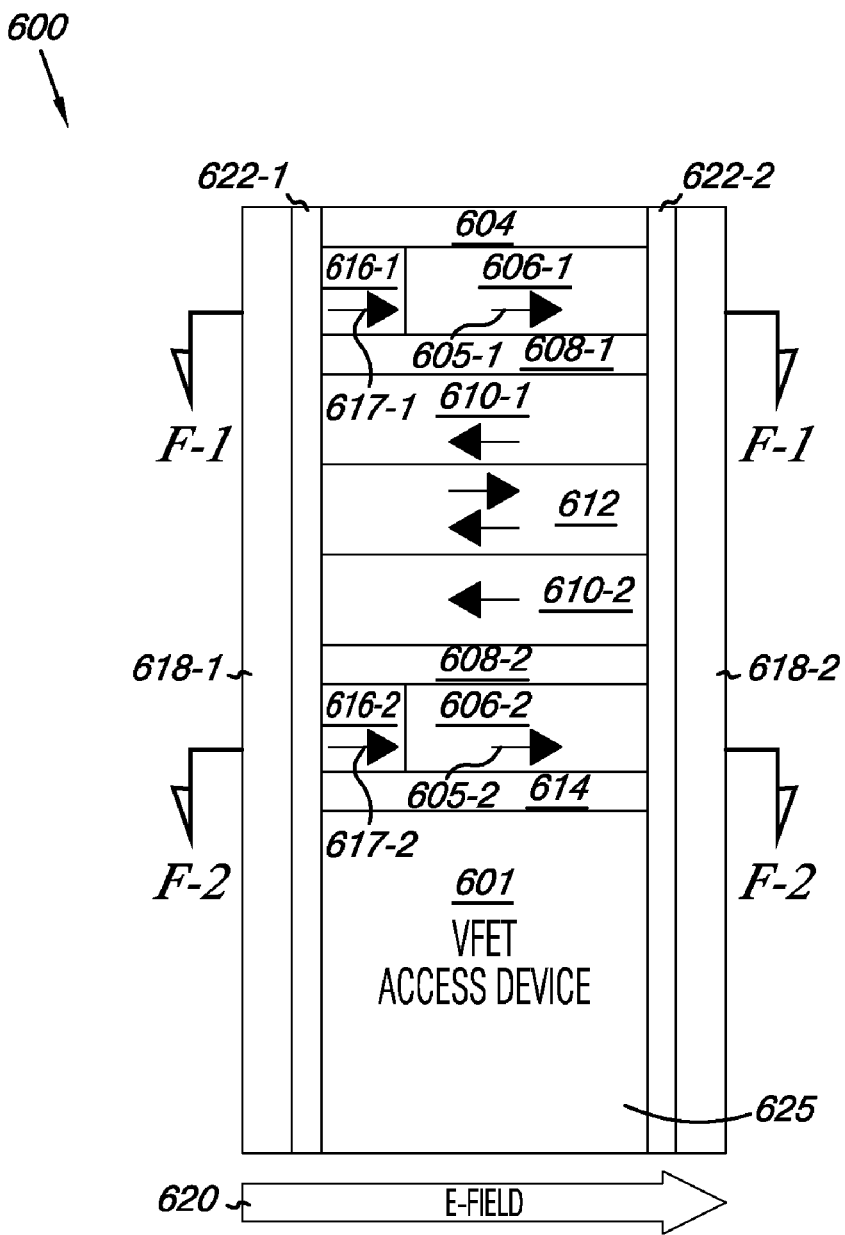
FIG. 6 illustrates an STT memory cell structure in accordance with one or more embodiments of the present disclosure.

FIG. 6 illustrates an STT memory cell structure 600 in accordance with one or more embodiments of the present disclosure. The memory cell structure 600 is a multi-bit STT RAM structure similar to the STT stack structure 500 shown in FIG. 5. For instance, the stack structure 600 includes multiple levels configured for data storage. The stack structure 600 comprises a first level including a first ferromagnetic storage material 606-1 in contact with a first multiferroic material 616-1, with a first tunneling barrier material 608-1 positioned between the first ferromagnetic storage material 606-1 and a first pinned ferromagnetic material 610-1. The stack structure 600 comprises a second level including a second ferromagnetic storage material 606-2 in contact with a second multiferroic material 616-2, with second tunneling barrier material 608-2 positioned between the second ferromagnetic storage material 606-2 and a second pinned ferromagnetic material 610-2. The first and second levels of stack structure 600 are separated by an anti ferromagnetic material 612 positioned between, and in contact with, the first and the second pinned ferromagnetic materials 610-1 and 610-2, respectively. The multiferroic materials 616-1 and 616-2 are each located between a first gate electrode 618-1 and a second gate electrode 618-2 of a vertical access device 625 coupled to the stack structure 600. In this example, a gate oxide material 622-1 and 622-2 associated with vertical access device 625 separates portions of the stack 600 from the gate electrodes 618-1 and 618-2, respectively.

Application of an electric field to the multiferroic materials 616-1 and 616-2 (e.g., via an applied voltage difference between the gate electrodes 618-1 and 618-2) can be used to manipulate the antiferromagnetic and/or ferromagnetic ordering of the multiferroic materials 616-1 and 616-2. Due to exchange coupling between the first multiferroic material 616-1 and the first ferromagnetic storage material 606-1 and due to exchange coupling between the second multiferroic material 616-2 and the second ferromagnetic storage material. 606-2, the magnetic ordering of the multiferroic materials 616-1 and 616-2 influences the magnetization directions 605-1 and 605-2 of the ferromagnetic storage materials 606-1 and 606-2, respectively.

The embodiment of FIG. 6 illustrates an electric field 620 provided to the multiferroic materials 616-1 and 616-2. The arrows 617-1 and 617-2 indicate the induced magnetization direction within the multiferroic material 616-1 and 616-2, due to the applied electric field 620. Arrow 605-1 indicates the magnetization direction of the first ferromagnetic storage material 606-1 (e.g., antiparallel to the magnetization direction of the pinned ferromagnetic material 610-1, in this example). Arrow 605-2 indicates the magnetization direction of the second ferromagnetic storage material 606-2 (e.g., antiparallel to the magnetization direction of the pinned ferromagnetic material 610-2, in this example). The arrows 617-1, 617-2, 605-1, and 605-2 are examples and may not represent the actual order parameter orientations within the respective materials.

The STT memory cell structure 600 is configured such that an inner edge portion of the first multiferroic material 616-1 is in contact with a first edge portion of the first ferromagnetic storage material 606-1 and an inner edge portion of the second multiferroic material 616-2 is in contact with a first edge portion of the second ferromagnetic storage material 606-2. As such, the multiferroic materials 616-1 and 616-2 are in line with the first ferromagnetic storage material 606-1 and the second ferromagnetic storage material 606-2, respectively. The respective outer edges of the multiferroic materials 616-1 and 616-2 are aligned with respective outer edges of the first tunneling barrier material 608-1 and the second tunneling barrier material 608-2, in this example.

An overhead cross-sectional view through cut line F-1 or cut line F-2 shown in FIG. 6 can be a cross-sectional view such as that shown in FIG. 2B. However, embodiments are not limited to a particular structure. For instance, the structure 600 may not include dual opposing gate electrodes.

In one or more embodiments, the first multiferroic material 616-1 can have a ferroelectric polarizability that is different from the ferroelectric polarizability of the second multiferroic material 616-2 (e.g., the first and second multiferroic materials can he different multiferroic materials, in some embodiments). As an example, the first multiferroic material 616-1 may be $BiFeO_3$ (BFO) and the second multiferroic material may be $TbMn_2O_5$.

In various embodiments, the magnetization directions 605-1 and 605-2 can be altered via an applied electric field (e.g., 620), as described herein. The different relative orientations of magnetization directions 605-1 and 605-2 can correspond to different resistance values of the stack structure 600, which can in turn correspond to multiple different data states. For example, a read operation can be performed by providing a read current through the stack 600 (e.g., via a bit line and source line as described in FIG. 8) and determining a resistance level associated therewith (e.g., via a sensed voltage difference between the bit line and source line). As one example, the resistance level of the structure 600 when the magnetization 605-1 and 605-2 are both antiparallel to the magnetization of the pinned ferromagnetic materials 610-1 and 610-2 (e.g., as shown in FIG. 6) can correspond to a first multi-bit data state (e.g., "11"). In this example, the resistance level of the structure 600 when the magnetization 605-1 is antiparallel to material 610-1 and the magnetization 605-2 is parallel to material 610-2 can correspond to a second multi-bit data state (e.g., "10"), the resistance level of the structure 600 when the magnetization 605-1 is parallel to material 610-1 and the magnetization 605-2 is antiparallel to material 610-2 can correspond to a third multi-bit data state (e.g., "01"), and the resistance level of the structure 600 when the magnetizations 605-1 and 605-2 are both parallel to materials 610-1 and 610-2 can correspond to a fourth multi-bit data state (e.g., "00").

Figure 7:
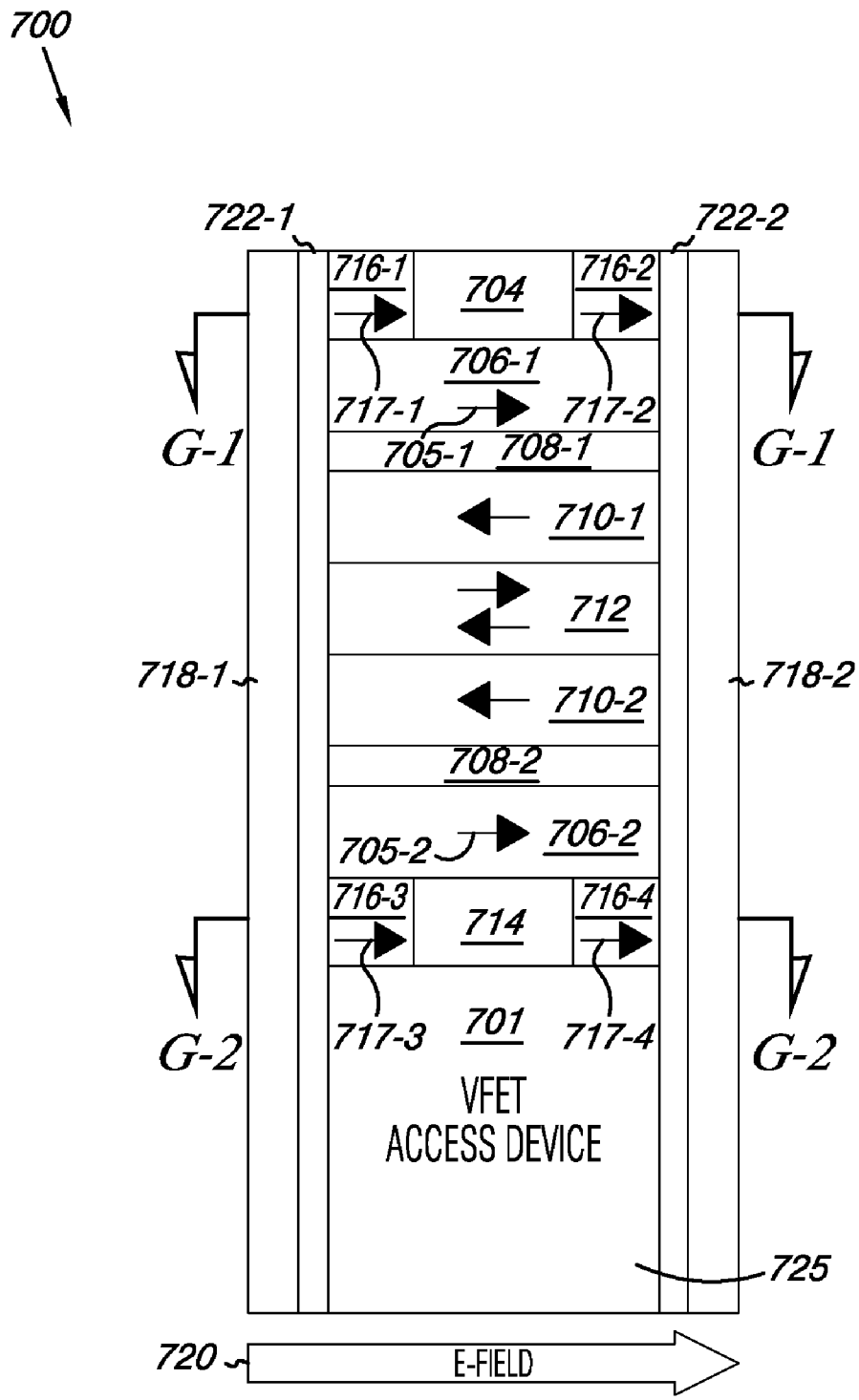
FIG. 7 illustrates an STT memory cell structure in accordance with one or more embodiments of the present disclosure.

FIG. 7 illustrates an STT memory cell structure 700 in accordance with one or more embodiments of the present disclosure. The memory cell structure 700 is a multi-bit STT RAM structure and is similar to the STT stack structure 300 shown in FIG. 3A. However, the stack structure 700 includes multiple levels configured for data storage. For instance, the stack structure 700 comprises a first level including a first ferromagnetic storage material 706-1 in contact with a first multiferroic material 716-1 and a second multiferroic material 716-2. A first tunneling barrier material 708-1 is positioned between the first ferromagnetic storage material 706-1 and a first pinned ferromagnetic material 710-1. The stack structure 700 comprises a second level including a second ferromagnetic storage material 706-2 in contact with a third multiferroic material 716-3 and a fourth multiferroic material 716-4. A second tunneling barrier material 708-2 is positioned between the second ferromagnetic storage material 706-2 and a second pinned ferromagnetic material 710-2. The first and second levels of stack structure 700 are separated by an antiferromagnetic material 712 positioned between, and in contact with, the first and the second pinned ferromagnetic materials 710-1 and 710-2, respectively. The multiferroic materials 716-1, 716-2, 716-3, and 716-4 are each located between a first gate electrode 718-1 and a second gate electrode 718-2 of a vertical access device 725 coupled to the stack structure 700. In this example, a gate oxide material 722-1 and 722-2 associated with vertical access device 725 separates portions of the stack 700 from the gate electrodes 718-1 and 718-2, respectively.

The magnetization directions 705-1 of ferromagnetic storage material 706-1 and 705-2 of ferromagnetic storage material 706-2 can be altered and/or controlled via application of electric fields, (e.g., due to exchange coupling between the multiferroic material 716-1, 716-2, 716-3, and 71.6-4 and the ferromagnetic storage materials 706-1 and 706-2, as described herein). The embodiment of FIG. 7 illustrates an electric field 720 provided to the multiferroic materials 716-1, 716-2, 716-3, and 716-4 via an applied voltage difference between the gate electrodes 718-1 and 718-2. The arrows 717-1 and 717-2 indicate the induced magnetization direction within the multiferroic material 716-1 and 716-2, respectively, due to the applied electric field 720. The arrows 717-3 and 717-4 indicate the induced magnetization direction within the multiferroic material 716-3 and 716-4, respectively, due to the applied electric field 720. Arrow 705-1 indicates the magnetization direction of the ferromagnetic storage material 706-1 (e.g., antiparallel to the magnetization direction of the pinned ferromagnetic material 710-1, in this example). Arrow 705-2 indicates the magnetization direction of the ferromagnetic storage material 706-2 (e.g., antiparallel to the magnetization direction of the pinned ferromagnetic material 710-2, in this example). The arrows 717-1, 717-2-2, 717-3, 717-4, 705-1, and 705-2 are examples and may not represent the actual order parameter orientations within the respective materials.

The STT memory cell structure 700 is configured such that the first multiferroic material 716-1 and the second multiferroic material 716-2 are in contact with a top surface of the first ferromagnetic storage material 706-1. The third multiferroic material 716-3 and the fourth multiferroic material 716-4 are in contact with a bottom surface of the second ferromagnetic storage material 706-2. The STT memory cell structure 700 is configured such that an inner edge portion of the first multiferroic material 716-1 and an inner edge portion of the second multiferroic material 716-2 are each in contact with a respective edge portion of the top electrode 704. An inner edge portion of the third multiferroic material 716-3 and an inner edge portion of the fourth multiferroic material 716-4 are each in contact with a respective edge portion of the bottom electrode 714. The multiferroic material 716-1/716-2 can have a different ferroelectric polarizability than the multiferroic material 716-3/716-4, in some embodiments.

An overhead cross-sectional view through cut line G-1 or cut line G-2 shown in FIG. 7 can be a cross-sectional view such as those shown in FIG. 3B. However, embodiments are not limited to a particular structure. For instance, the structure 700 may not include dual opposing gate electrodes such as shown in FIG. 3B.

The electrodes described herein (e.g., 104, 114, 118-1, 118-2, 118-3, 118-4) can be made of various conductive materials or composite structures including, but not limited to, titanium (Ti), TiN (titanium nitride), TaN (tantalum nitride), copper, iridium, platinum, ruthenium, tantalum, and/or tungsten, for example. As an example, in one or more embodiments, the bottom electrode (e.g., 114, 214, 314, etc.) can include a seed material or can include a seed material/conductive material/capping material composite configuration.

Although embodiments are not limited to particular materials, the ferromagnetic storage materials (e.g., 106, 206, 306, 406, 506-1, 506-2, etc.) can be CoFeB, NiFe, or antiferromagnetically coupled materials such as CoFeB/Ru/CoFeB, for example. The tunneling barrier material (e.g., 108, 208 308, 408, 508-1, 508-2, etc.) can be MgO, $Al_2O_3$, or other magnetic insulators, for example. The pinned ferromagnetic material (e.g., 110, 210, 310, 410, 510-1, 510-2, etc.) can be Fe, FeNi, Co, FeB, CoFeB, or various synthetic antiferromagnetic (SAF) structures such as CoFe/Ru/CoFe or CoFe/Ru/CoFeB, for example. The antiferromagnetic material (e.g., 112, 212, 312, 412, 512, etc.) can be NiO, CoO, FeMn, PtMn, IrMn, or NiMn, or a synthetic antiferromagnet (e.g., a composite structured antiferromagnet), for example. The multiferroic material (e.g., 116-1, 116-2, 116-3, 116-4, 516-1, 516-2, 516-3, 516-4, etc.) can be $BiFeO_3$ (BFO), $TbMn_2O_5$, or $TbMnO_3$, for example. The multiferroic material can also be $Bi_4Fe_2TiO_{12}$ or $NiBi_2O_4$ (e.g., when the multiferroic is a ferroelectric ferromagnetic multiferroic).

Figure 8:
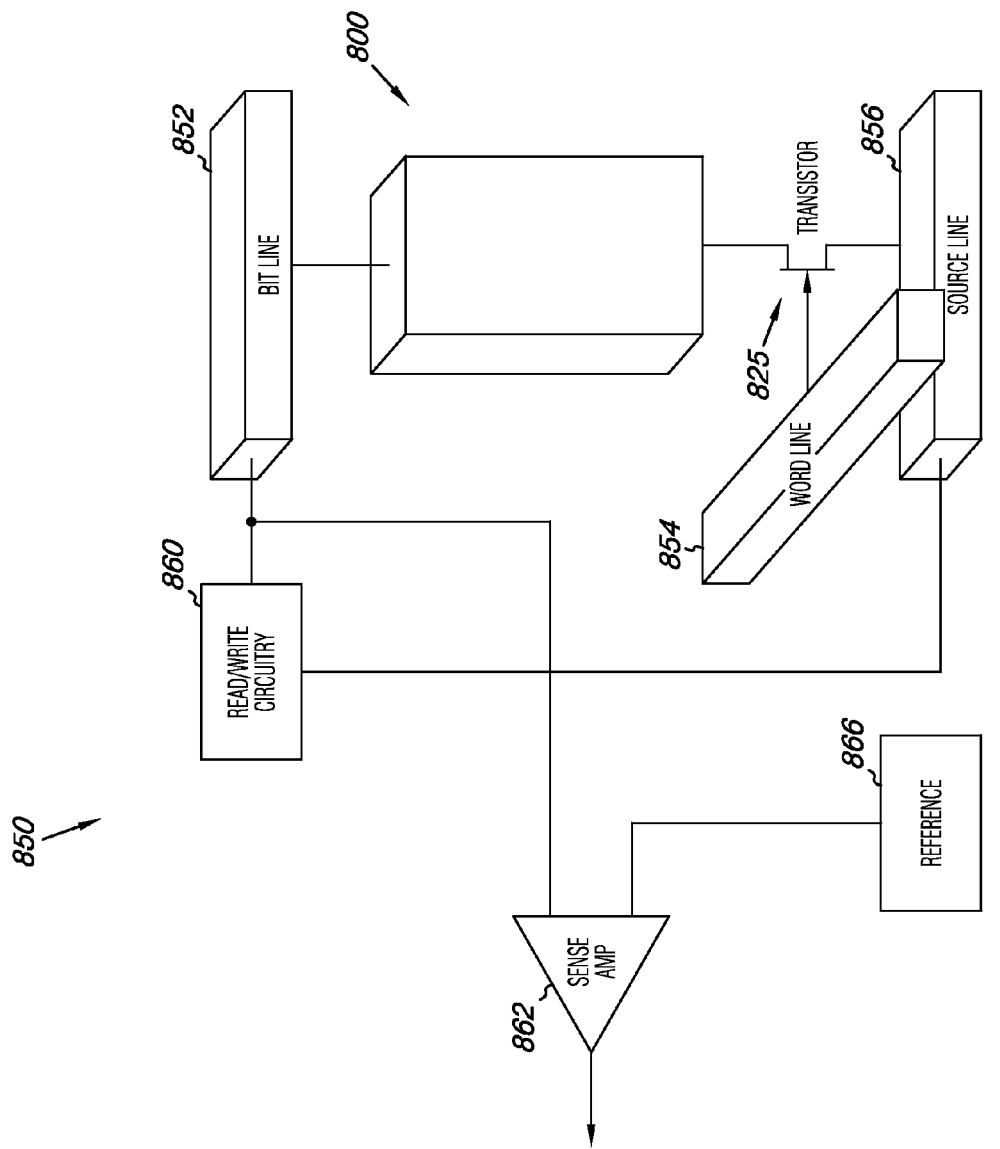
FIG. 8 illustrates a portion of a memory array having one or more STT memory cell structures in accordance with one or more embodiments of the present disclosure.

FIG. 8 illustrates a portion of a memory array 450 having one or more STT memory cell structures in accordance with one or more embodiments of the present disclosure. An STT RAM cell can include an STT memory cell structure (e.g., such as structures 100, 200, 300, 400, 500, 600, and 700 described above) coupled to an access transistor 825. The access transistor 825 can be a vertical FET such as those shown in FIGS. 1A-7.

In this example, the array 850 includes a bit line 852, a word line 854, a source line 856, read/write circuitry 860, a bit line reference 866, and a sense amplifier 862. The STT memory structure 800 can include one or more MTJ elements. As described above, the STT memory structure 800 can include a multiferroic material coupled to (e.g., in contact with) one or more portions of a ferromagnetic storage material of the STT memory cell structure 800.

In operation, the STT memory cell structure 800 can be selected to be programmed. An electric field can be provided via voltage differences applied across electrodes corresponding to structure 800 in order to induce magnetic polarization changes in the multiferroic material of the structure 800, which results in corresponding magnetization changes within the ferromagnetic storage material(s) of structure 800. In various instances, the applied electric field can be sufficient to switch the magnetization direction of the storage material(s) without providing additional programming current to the cell).

In instances in which the applied electric field is not sufficient to induce full switching of the magnetization of the ferromagnetic storage material(s), a programming current can be applied to the cell, and the current can be spin-polarized by the pinned ferromagnetic materials) of the cell structure 800 such that a torque (e.g., a torque in addition to the torque provided to the magnetic moments within the ferromagnetic storage materials) due to the exchange coupling between the storage material(s) and one or more multiferroic materials in contact therewith) is exerted on the ferromagnetic storage materials) (e.g., ferromagnetic storage materials 106, 206, 306, 506-1, or 506-2, etc., as described above), which can switch the magnetization of the ferromagnetic storage materials) to program (e.g. write to) the cell. In this manner, the application of the electric field can be used to reduce the programming current (e.g., the critical switching current) required to switch the magnetization directions within the ferromagnetic storage material(s) of the STT memory cell.

In programming operations in which a programming current is used, the read/write circuitry 860 may generate a programming current to the bit line 852 and the source line 856. Once the ferromagnetic storage material is magnetized according to the spin polarity of the programming current, the programmed state is written to the STT RAM cell.

To read the STT RAM cell, the read/write circuitry 860 generates a read current to the bit line 852 and the source line 856 through the structure 800 and the transistor 825. The programmed state of the STT RAM cell depends on the resistance across the structure 800, which may be determined by the voltage difference between the bit line 852 and the source line 856. In one or more embodiments, the voltage difference may be compared to a reference 866 and amplified by a sense amplifier 862.

One or more embodiments of the present disclosure can induce magnetization switching within an STT RAM cell via applied electric fields, which can provide various benefits. For instance, embodiments can reduce the current density required to induce magnetization switching in STT RAM cells. Embodiments can also assist with preventing thermally induced magnetic switching, which can provide added reliability and/or stability associated with STT RAM cells, among other benefits. Embodiments can include multi-bit STT memory cell structures having reduced current density requirements for programming and can have a reduced physical footprint as compared to previous STT memory cells.

STT memory cell structures and methods are described herein. One or more STT memory cell structures comprise a STT stack including: a pinned ferromagnetic material in contact with an antiferromagnetic material; a tunneling barrier material positioned between a ferromagnetic storage material and the pinned ferromagnetic material; a multiferroic material in contact with the ferromagnetic storage material; and a first electrode and a second electrode, wherein the anti ferromagnetic material, the pinned ferromagnetic material, and the ferromagnetic storage material are located between the first electrode and the second electrode. The STT memory cell structure can include a third electrode and a fourth electrode, wherein at least a first portion of the multiferroic material is located between the third and the fourth electrode.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A spin torque transfer (STT) memory cell structure, comprising:
   a STT stack including:
      a pinned ferromagnetic material in contact with an antiferromagnetic material;
      a tunneling barrier material positioned between a ferromagnetic storage material and the pinned ferromagnetic material;
      a multiferroic material in contact with the ferromagnetic storage material; and
      a first electrode and a second electrode wherein the antiferromagnetic material, the pinned ferromagnetic material, and the ferromagnetic storage material are located between the first electrode and the second electrode;
   a third electrode and a fourth electrode, wherein at least a first portion of the multiferroic material is located between the third and the fourth electrode; and
   a fifth electrode and a sixth electrode, wherein at least a second portion of the multiferroic material is located between the fifth and the sixth electrode.

2. The memory cell structure of claim 1, wherein the third electrode and the fourth electrode are configured to provide an electric field to the at least a first portion of the multiferroic material responsive to an applied voltage between the third electrode and the fourth electrode.

3. The memory cell structure of claim 2, wherein the electric field provided to the at least a first portion of the multiferroic material is sufficient to:
   induce a change in antiferromagnetic and/or ferromagnetic ordering of the multiferroic material; and
   provide antiferromagnetic exchange coupling and/or ferromagnetic exchange coupling between the multiferroic material and the ferromagnetic storage material such that a magnetization of the ferromagnetic storage material is altered.

4. The memory cell structure of claim 2, wherein at least one of the third electrode and the fourth electrode is a gate of a vertical access device coupled to the STT memory cell structure.

5. The memory cell structure of claim 1, wherein the fifth electrode and the sixth electrode are configured to provide an electric field to the at least a second portion of the multiferroic material responsive to an applied voltage between the fifth electrode and the sixth electrode.

6. The memory cell structure of claim 1, wherein the at least one of the third and the fourth electrode is in contact with the at least a first portion of the multiferroic material.

7. The memory cell structure of claim 1, wherein at least a portion of the at least a first portion of the multiferroic material is located beneath the ferromagnetic storage material.

8. The memory cell structure of claim 7, wherein an inner edge portion of the at least a first portion of the multiferroic material is in contact with an inner edge portion of the second electrode.

9. The memory cell structure of claim 7, wherein an outer edge portion of the at least a first portion of the multiferroic material is in line with an outer edge portion of the ferromagnetic storage material.

10. The memory cell structure of claim 1, wherein an inner edge portion of the at least a first portion of the multiferroic material is in contact with an outer edge portion of the ferromagnetic storage material.

11. The memory cell structure of claim 1, wherein at least a portion of the at least a first portion of the multiferroic material is in contact with the second electrode and the tunneling barrier material.

12. The memory cell structure of claim 11, wherein an outer edge portion of the at least a first portion of the multiferroic material is in line with an outer edge portion of the tunneling barrier material.

13. A spin torque transfer (STT) memory cell, comprising:
   a magnetic tunneling junction (MTJ) element positioned between a first electrode and a second electrode;
   a first multiferroic material having an inner edge portion in contact with a ferromagnetic storage material of the MTJ element;
   a second multiferroic material having an inner edge portion in contact with the ferromagnetic storage material of the MTJ element; and
   a vertical access device coupled to the MTJ element, wherein the first multiferroic material is located between a first gate electrode and a second gate electrode of the vertical access device;
   wherein the vertical access device includes a third and a fourth gate electrode, and wherein the memory cell includes at least a third multiferroic material in contact with the ferromagnetic storage material and located between the third and the fourth gate electrode.

14. The memory cell of claim 13, wherein the inner edge portion of the first multiferroic material is in contact with a first edge portion of the ferromagnetic storage material.

15. The memory cell of claim 13, wherein the first gate electrode and the second gate electrode are configured to provide an electric field to the first multiferroic material responsive to an applied voltage difference between the first gate electrode and the second gate electrode.

16. The memory cell of claim 13, wherein the inner edge portion of the second multiferroic material is in contact with a second edge portion of the ferromagnetic storage material.

17. The memory cell of claim 13, wherein the second multiferroic material is located between the first gate electrode and the second gate electrode.

18. A spin torque transfer (STT) memory cell, comprising:
a magnetic tunneling junction (MTJ) element positioned between a first electrode and a second electrode;
a first multiferroic material having an upper surface portion in contact with a ferromagnetic storage material of the MTJ element;
a second multiferroic material having an upper surface portion in contact with the ferromagnetic storage material of the MTJ element; and
a vertical access device coupled to the MTJ element, wherein the first multiferroic material is located between a first gate electrode and a second gate electrode of the vertical access device;
wherein the vertical access device includes a third and a fourth gate electrode, and wherein the memory cell includes at least a third multiferroic material in contact with the ferromagnetic storage material and located between the third and the fourth gate electrode.

19. The memory cell of claim 18, wherein an edge portion of the first multiferroic material is in contact with the second electrode.

20. The memory cell of claim 18, wherein the first gate electrode and the second gate electrode are configured to provide an electric field to the first multiferroic material responsive to an applied voltage difference between the first gate electrode and the second gate electrode.

21. The memory cell of claim 18, wherein an edge portion of the second multiferroic material is in contact with the ferromagnetic storage material.

22. The memory cell of claim 18, wherein the second multiferroic material is located between the first gate electrode and the second gate electrode.

23. A spin torque transfer (STT) memory cell, comprising:
a first ferromagnetic storage material in contact with a first multiferroic material;
a first tunneling barrier material positioned between the first ferromagnetic storage material and a first pinned ferromagnetic material;
a second ferromagnetic storage material in contact with a second multiferroic material;
a second tunneling barrier material positioned between the second ferromagnetic storage material and a second pinned ferromagnetic material;
a third multiferroic material in contact with the first ferromagnetic storage material; and
a vertical access device having a first gate electrode and a second gate electrode, wherein the first multiferroic material and the second multiferroic material are located between the first gate electrode and the second gate electrode.

24. The memory cell of claim 23, including an antiferromagnetic material positioned between and in contact with the first and the second pinned ferromagnetic material, the antiferromagnetic material also positioned between the first and the second ferromagnetic material.

25. The memory cell of claim 23, including a fourth multiferroic material in contact with the second ferromagnetic storage material.

26. The memory cell of claim 25, wherein the first and the third multiferroic materials have a first ferroelectric polarizability, and wherein the second and the fourth multiferroic materials have a second ferroelectric polarizability that is different than the first ferroelectric polarizability.

27. The memory cell of claim 25, wherein the first multiferroic material is in contact with a first side surface of the first ferromagnetic storage material and the third multiferroic material is in contact with a second side surface of the first ferromagnetic storage material.

28. The memory cell of claim 27, wherein the second multiferroic material is in contact with a first side surface of the second ferromagnetic storage material and the fourth multiferroic material is in contact with a second side surface of the second ferromagnetic storage material.

29. The memory cell of claim 25, wherein the first multiferroic material and the third multiferroic material are in contact with a top surface of the first ferromagnetic storage material.

30. The memory cell of claim 29, wherein the second multiferroic material and the fourth multiferroic material are in contact with a bottom surface of the second ferromagnetic storage material.

31. The memory cell of claim 23, wherein the first and the second multiferroic materials have different ferroelectric polarizabilities.

32. The memory cell of claim 31, including a top electrode in contact with the first ferromagnetic storage material and a bottom electrode in contact with the second ferromagnetic storage material.

33. A method of operating a spin torque transfer (STT) memory cell, the method comprising:
providing, via an applied voltage difference between a first and a second gate electrode of a vertical access device, an electric field to a first multiferroic material in contact with a first ferromagnetic storage material; and
providing, via an applied voltage difference between a third and a fourth gate electrode of the vertical access device, an electric field to a second multiferroic material in contact with the first ferromagnetic storage material;
wherein at least one of the electric field between the first and the second gate electrode and the electric field between the third and the fourth gate electrode is sufficient to alter a magnetization direction of the first ferromagnetic storage material via exchange coupling between the first multiferroic material and the first ferromagnetic storage material.

34. The method of claim 33, wherein the electric field is sufficient to induce a switching of the magnetization direction of the first ferromagnetic storage material from a first configuration corresponding to a first data state of the STT memory cell to a second configuration corresponding to a second data state of the STT memory cell.

35. The method of claim 34, wherein the switching of the magnetization direction of the first ferromagnetic storage material includes switching the magnetization direction from at least one of:
a configuration parallel to a magnetization direction of a pinned ferromagnetic material coupled to the first ferromagnetic storage material to a magnetization direction antiparallel to the magnetization direction of the pinned ferromagnetic material; and
a configuration antiparallel to the magnetization direction of the pinned ferromagnetic material to a magnetization direction parallel to the magnetization direction of the pinned ferromagnetic material.

36. The method of claim 33, including subsequently providing a programming current through the STT memory cell element in a current perpendicular to plane (CPP) configuration.

37. The method of claim 36, including determining a data state of the STT memory cell subsequent to providing the programming current.

38. The method of claim 33, wherein the STT memory cell includes a stack of materials positioned between a bottom electrode and a top electrode, the stack comprising:
- the first ferromagnetic storage material;
- the first multiferroic material;
- an antiferromagnetic material in contact with the pinned ferromagnetic material; and
- a tunneling barrier material between the pinned ferromagnetic material and the antiferromagnetic material; and
- wherein the first ferromagnetic storage material is in contact with at least one of the bottom electrode and the top electrode.

39. The method of claim 33, wherein the method includes:
- providing, via the applied voltage difference between the first and the second gate electrode of the vertical access device, the electric field to a second multiferroic material in contact with a second ferromagnetic storage material; and
- wherein the electric field is sufficient to alter a magnetization direction of the second ferromagnetic storage material via exchange coupling between the second multiferroic material and the second ferromagnetic storage material.

40. The method of claim 39, wherein the STT memory cell includes a stack of materials positioned between a bottom electrode and a top electrode, the stack comprising:
- the first ferromagnetic storage material and the second ferromagnetic storage material;
- the first multiferroic material and the second multiferroic material;
- a first tunneling barrier material between the first ferromagnetic storage material and a first pinned ferromagnetic material;
- a second tunneling barrier material between the second ferromagnetic storage material and a second pinned ferromagnetic material;
- an antiferromagnetic material in contact with and between the first pinned ferromagnetic material and the second pinned ferromagnetic material; and
- wherein the first ferromagnetic storage material is in contact with the top electrode and the second ferromagnetic storage material is in contact with the bottom electrode.

41. The method of claim 39, wherein the STT memory cell is configured to store at least two data bits.

42. The method of claim 39, wherein the first multiferroic material and the second multiferroic material have different ferroelectric polarizabilities.

43. A spin torque transfer (STT) memory cell structure, comprising:
- a STT stack including:
  - a pinned ferromagnetic material in contact with an antiferromagnetic material;
  - a tunneling barrier material positioned between a ferromagnetic storage material and the pinned ferromagnetic material;
  - a multiferroic material in contact with the ferromagnetic storage material, wherein the multiferroic material is continuous around the ferromagnetic storage material; and
  - a first electrode and a second electrode wherein the antiferromagnetic material, the pinned ferromagnetic material, and the ferromagnetic storage material are located between the first electrode and the second electrode; and
- a third electrode and a fourth electrode, wherein at least a first portion of the multiferroic material is located between the third and the fourth electrode.

44. A spin torque transfer (STT) memory cell, comprising:
- a first ferromagnetic storage material in contact with a first multiferroic material;
- a first tunneling barrier material positioned between the first ferromagnetic storage material and a first pinned ferromagnetic material;
- a second ferromagnetic storage material in contact with a second multiferroic material;
- a second tunneling barrier material positioned between the second ferromagnetic storage material and a second pinned ferromagnetic material;
- wherein the first multiferroic material is continuous and surrounds the first ferromagnetic storage material, and wherein the second multiferroic material is continuous and surrounds the second ferromagnetic storage material; and
- a vertical access device having a first gate electrode and a second gate electrode, wherein the first multiferroic material and the second multiferroic material are located between the first gate electrode and the second gate electrode.

* * * * *